United States Patent [19]

Herold

[11] Patent Number: 4,518,869

[45] Date of Patent: May 21, 1985

[54] RESISTANCE COMPARATOR FOR SWITCH DETECTION

[75] Inventor: Barry W. Herold, Lauderhill, Fla.

[73] Assignee: Motorola, Inc., Schaumburg, Ill.

[21] Appl. No.: 451,662

[22] Filed: Dec. 21, 1982

[51] Int. Cl.³ .................... H03K 5/153; H03K 5/24
[52] U.S. Cl. ................................. 307/350; 307/362; 330/288
[58] Field of Search ............... 307/350, 354, 362, 363; 330/288

[56] References Cited

U.S. PATENT DOCUMENTS

| | | | |
|---|---|---|---|
| 3,789,291 | 1/1974 | Dinger et al. | 307/350 |
| 3,904,888 | 9/1975 | Griffin et al. | |
| 4,023,050 | 5/1977 | Fox et al. | |
| 4,059,956 | 11/1977 | Baker | |
| 4,188,588 | 2/1980 | Dingwall | 307/350 |
| 4,249,095 | 2/1981 | Hsu | 307/350 |
| 4,322,639 | 3/1982 | Yamashiro | 307/350 |
| 4,345,172 | 8/1982 | Maeda et al. | |
| 4,347,440 | 8/1982 | Baker | |
| 4,352,141 | 9/1982 | Kent | |

*Primary Examiner*—John Zazworsky
*Attorney, Agent, or Firm*—Joseph T. Downey; James W. Gillman; Edward M. Roney

[57] ABSTRACT

In a resistance comparator circuit a current mirror provides a reference current to a first conduction path and a mirror current to a second conduction path. A first transistor is coupled in series with the first conduction path and a reference resistance is coupled in series with the first transistor. A second transistor is coupled in series with the second conduction path and an input resistor is placed in series with the second transistors. A bias circuit supplies a bias signal to the control nodes of the first and second transistor. A logic transition occurs when the input resistor is equal to the reference resistor or a predetermined multiple thereof.

18 Claims, 3 Drawing Figures

RESISTANCE COMPARATOR FOR SWITCH DETECTION

BACKGROUND OF THE INVENTION

1. Field of the Invention

This invention relates to a digital resistance comparator circuit used as a switch detector. More generally, this invention relates to a circuit which compares an input resistance to a reference resistance and provides a logical 1 or 0 output indicative of the relative values of the compared resistances. In the preferred embodiment a logic 0 occurs at the output when the input resistance is less than the reference resistance and a logic 1 occurs at the output when the input resistance is more than the reference resistance.

2. Background of the Invention

As mechanical switches, such as poppel switches, elastomer switches and even toggle switches, wear with a combination of use and exposure to the environmental elements, the resistance at the switch contacts increases until the switch is deemed unusable. While the contact resistance of new switches may intitially only be a fraction of an ohm, the contact resistance of worn switches has been measured at as much as 20K ohms. Such drastic changes in contact resistance can create a serious reliability problem. It is therefore desirable to extend the useful life of the switch by electronically positively detecting the closing of a switch contact over an extended range of contact resistances.

A standard prior art switch-to-ground detect circuit is shown in FIG. 1. In this circuit the input 10 of inverter 15 is connected to a first terminal of resistor 20. The second terminal of resistor 20 is connected to a positive DC voltage supply. Also connected to the input 10 of inverter 15 is a switch 25. The switch is connected from input 10 to ground in normal operation. The output of the detection circuit is taken at the output 30 of inverter 15.

In operation, the input 10 is normally pulled to a logical high voltage level by resistor 20 which is connected to the DC source resulting in a logic low appearing at output 30. When the user closes switch 25, the contact resistance is effectively connected from the input 10 to ground. If this resistance is sufficiently small, the voltage at input 10 will drop below the transition voltage of inverter 15 causing a logical high to appear at output 30 indicating a switch closure has occurred.

Although the simple circuit of FIG. 1 operates adequately for most applications, it has a number of serious drawbacks which prohibit its use in conjunction with many low voltage, low current electronic devices such as electronic paging receivers. Such devices typically operate from a single small low capacity battery which supplies a voltage on the order of 1.2 to 3 volts. In such low supply voltage environment, the gain of the CMOS inverter used in the prior art circuit is much lower than normal especially at temperature range extremes. This results in inverter 15 operating in more of a linear fashion having an output inversely proportional to the input resistance 25 rather than having a sharply defined logical transition which occurs at a fixed, predetermined point. As a result, the prior art circuit could prematurely fail to give a positive indication of switch actuation. Also, the contact resistance at which the circuit no longer functions is heavily dependent upon the fabrication processing parameters of inverter 15. This renders the characteristics of the prior art circuit highly unpredictable at best.

Furthermore, many pagers and similar devices require an extremely low standby current drain, often less than 1.5 mA, which allows even a single penlight type battery to last for weeks. For the circuit of FIG. 1, the value of pull-up resistor 20 is generally on the order of 30K ohms. This value allows reliable switch operation even at 20K ohms of contact resistance while making the circuit relatively immune to stray input resistance to ground caused by P.C. board corrosion, etc. Unfortunately, this value predetermines that this prior art circuit will utilize between 50 and 300 microamps during standby even assuming a low power CMOS inverter is used. For low current devices such as paging receivers, this is an unacceptably high current drain resulting in substantially shortened battery life. Therefore, it is impractical to attain any of the advantages afforded by the prior art switch detect circuit in low current, low voltage electronic devices.

SUMMARY OF THE INVENTION

It is an object of the present invention to provide an improved switch detect circuit.

It is another object of the present invention to provide a resistance comparator circuit which provides a logical output in response to a resistive input for use as a switch detector.

It is a further object of the present invention to provide an improved switch detection circuit which will operate at very low voltages and consume very little current while providing greater insensitivity to changes in switch contact resistance.

In one embodiment of the present invention a resistance comparator circuit includes a current source which supplies a reference current to a first conduction path and a limited current to a second conduction path. A first current control element has a control node for controlling the current flow in the first conduction path. A reference resistance is connected in series with the first conduction path. A second current control element has a second control node for controlling the current flow in the second conduction path. An input is coupled to the second conductive path for coupling an input resistance in series with that path. A bias circuit supplies bias to the first and second control nodes. In this circuit the output is in a first logic state when the input resistor is approximately equal to a predetermined value and in a second logic state when the input resistor is greater than the predetermined value.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DETAILED DESCRIPTION OF THE PREFERRED EMBODIMENT

Figure 1:
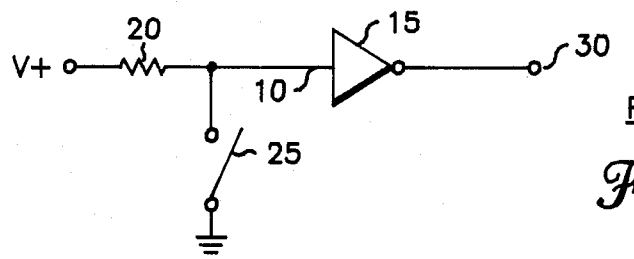
FIG. 1 is an electrical schematic drawing of the switch detect circuit of the prior art.
Figure 2:
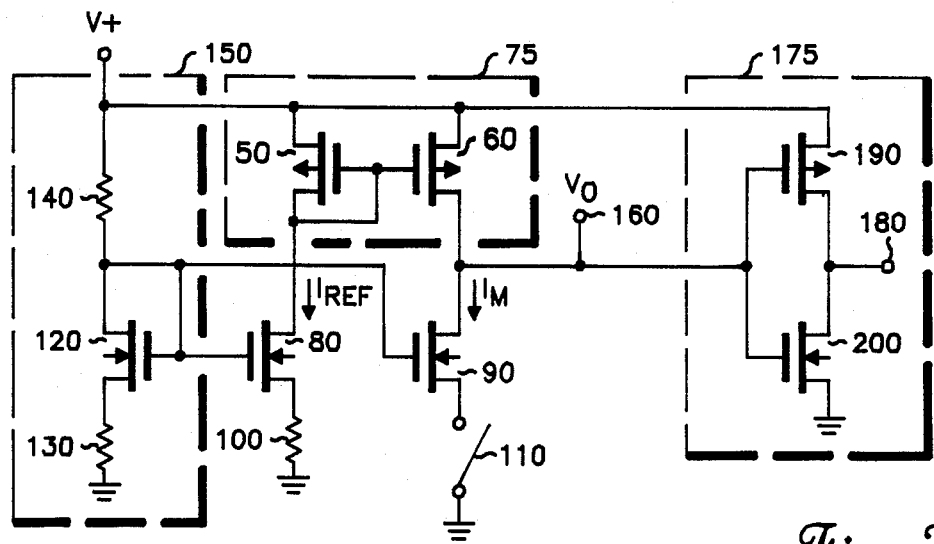
FIG. 2 is an electrical schematic drawing of the preferred embodiment of the present invention.
Figure 3:
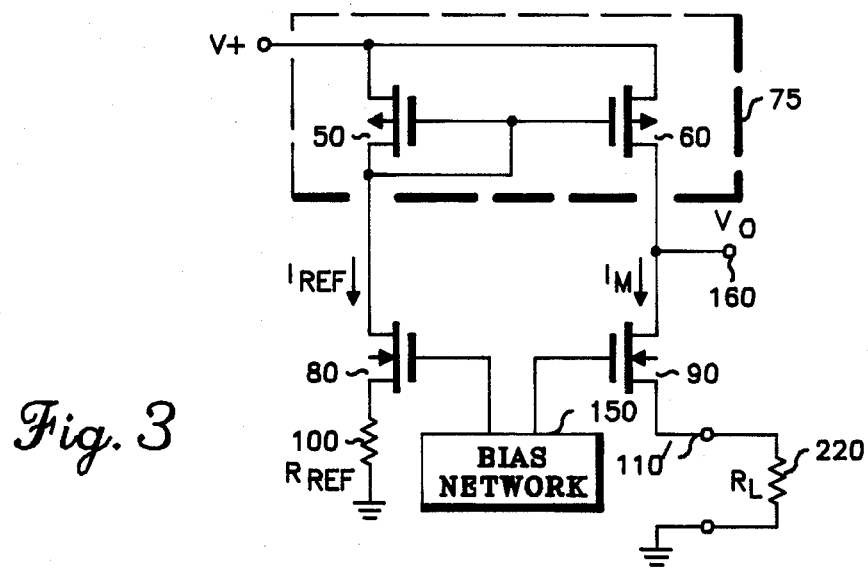
FIG. 3 is a simplified electrical schematic representation of the present invention.

Turning now to FIG. 2 of the preferred embodiment of the present invention in conjunction with FIG. 3 of a simplified representation of the present invention, transistors 50 and 60 are connected to form a current mirror 75 shown enclosed by a broken line. In this embodiment, both transistors 50 and 60 are P-type field effect transistors but this is not to be construed as limiting as one skilled in the art could readily implement a current mirror of the oppositive conductivity. The sources of transistors 50 and 60 are connected to a DC supply voltage designated here as V+. The gates of transistors 50 and 60 are coupled together and in turn coupled to the drain of transistor 50. The drain of transistor 50 is connected to the drain of an N-type transistor 80. The drain of transistor 60 is connected to the drain of another N-type transistor 90. The gates of transistors 80 and 90 are normally coupled together. A resistor 100, to be designated the reference resistor ($R_{ref}$), is connected from the source of transistor 80 to ground. In FIG. 2 a switch 110 is connected between the source of transistor 90 (the circuit's input) and ground.

An N-type transistor 120 has its gate and drain connected together and that common point is coupled to the gates of transistors 80 and 90. A resistor 130 is connected from the source of transistor 120 to ground and another resistor 140 is connected from the drain of transistor 120 to the DC bias voltage V+. The series combination of resistors 130 and 140 and transistor 120 sets up a bias network 150 (shown enclosed by a broken line in FIG. 2 and in block diagram form in FIG. 3) which establishes a bias voltage on the gates of transistor 80 and 90. In addition, bias network 150 sets the current drain of the entire circuit.

The output is normally taken at the junction of the drain of transistor 60 and the drain of transistor 90 at the node designated 160 as clearly shown in FIG. 3. However, as shown in FIG. 2 the signal present at node 160 is often used to drive a high impedance logic gate such as inverter 175 (shown enclosed by a broken line) and the output is taken at node 180 which is the output of inverter 175. This inverter stage is comprised of a pair of transistors 190 and 200 of complementary conductivity. The source of P-type transistor 190 is connected to the positive most terminal of DC supply V+. The gate of transistor 190 is connected to the gate of N-type conductivity transistor 200 and that common point is driven by the signal at node 160. The source of transistor 200 is connected to ground and the drain of transistor 200 is connected to the drain of transistor 190 to form output node 180. It will be evident to those skilled in the art that analagous circuits and duals of this circuit which respond to switching action to V+ rather than ground may be readily generated by making appropriate substitutions with equivalent networks such as those made up of devices of opposite conductivity.

The operation of this invention may be best understood by reference to FIG. 3 which is a simplified schematic of the present invention which deletes inverter 175 and replaces bias network 150 with a block representation of that network. Any number of biasing networks could perform the same function as network 150, but the structure of network 150 is preferred due to its temperature compensating characteristics. The current drain of the circuit is determined by resistors 130 and 140 and can be set to an extremely low value on the order of two to three micro-amps.

Current mirror 75 operates to establish a reference current designated $I_{ref}$ entering the drain of transistor 80 as shown in FIGS. 2 and 3. As is well known in the art, a mirror current designated $I_m$ in FIG. 2 and FIG. 3 exits the drain of transistor 60. In operation, the mirror current $I_m$ will be limited to a value no greater than approximately $I_{ref}$ if transistors 50 and 60 have substantially identical characteristics.

In FIG. 3 the input is shown as node 110' and a resistor 220 is connected from node 110' to ground. Resistor 220 schematically represents the switch contact resistance of the preferred embodiment to ground. As will be appreciated by those skilled in the art, the components of bias network 150 should be selected to set the voltage at the drain of transistor 90 at approximately V+/2 with resistor 100 equal to resistor 220 in the preferred embodiment.

When resistor 220 is exactly equal to resistor 100 the output voltage Vo will equal one-half of the supply voltage V+ resulting in an indeterminant logic state. However, the impedance at node 160 is extremely high so that very small changes in the value of mirror current $I_m$ will result in very large voltage swings at the output node 160. It is not uncommon for current changes on the order of fractions of a microamp to induce voltage changes at node 160 of several volts. This results in extremely sharp transitions from logic low to logic high and vice-versa at the output 160 as a result a very small changes in resistor 220. Therefore, the probability of having an indeterminate voltage between logic high and logic low at node 160 is very low. This is especially true when inverter 175 (as shown in FIG. 2) is used since its gain will cause node 180 to saturate at either logic high or logic low except for narrow range of input voltages at node 160.

The value of resistor 220 may be viewed as infinitely high when switch 110 is open. When there is an infinitely high resistance 220 inserted in circuit of FIG. 3, the output voltage $V_o$ at terminal 160 is at a logic high which approaches the value of V+. Transistor 90 is turned off and the value of the mirror current $I_m$ is approximately 0. Similarly, a logic high output results whenever resistance 220 is larger than resistor 100.

When the value of resistor 220 is less than that of resistor 100 current mirror 75 limits the mirror current $I_m$ to a value approximately equal to $I_{ref}$. When this condition exists transistor 90 can sink more current than the limited current which can be derived from transistor 60 ($I_m$) and the output voltage drops to approximately 0 volts.

The preferred embodiment is designed to operate with a 3 volt DC supply and a 55K ohm resistor serves as resistor 130. A 1 M ohm resistor is used for resistor 140 and resistor 100 is 70K ohms. By contrast with the prior art, the circuit of the present invention uses only 3 micro amps while providing an accurate indication of switch closure for a switch contact resistance (R220) up to 70K ohms at room temperature. The present invention also provides a much narrower range of inputs resulting in indeterminate outputs than the prior art circuit.

By slight modification to current mirror 75 it is also possible to have the comparator change logic states as a result of resistor 220 being a predetermined multiple or fraction of resistor 100. This is a useful, for example, when resistor 100 is to be part of an integrated circuit and is too large or too small in value to be readily fabricated with the technology being employed. A number of ways of accomplishing this will occur to those skilled in the art, but perhaps the most logical technique is to use the well known current multiplying and dividing forms of current mirrors. This would normally be accomplished in CMOS by making transistors 50 and 60 different sizes. These forms would limit the value of $I_m$ to some multiple or fraction of $I_{ref}$ thereby appropriately scaling the relative magnitude of resistors 100 and 220 necessary to effect a logic change at node 160. For $I_m$ greater than $I_{ref}$, the comparator's transition will occur when $R_{ref}$ is greater than $R_L$. For $I_m$ less than $I_{ref}$ the comparator's transition will occur when $R_{ref}$ is less than $R_L$. The exact expression relating $I_m$, $I_{ref}$, $R_{ref}$, and $R_L$ is dependant upon fabrication parameters, but it is readily derived by one skilled in the art. Alternatively, the relationships may be experimentally derived.

In addition to the exceptionally low current consumption by the circuit of the present invention, it will be evident to those skilled in the art that this circuit is operable over a wide voltage supply range and will function with a supply as small as the largest threshold voltage of any of the transistors. This is in sharp contrast with the circuit of the prior art which may require a much larger minimum supply voltage in order to function and expends relatively large quantities of current in operation.

It should also be noted that the word transistor as used herein is intended to be generic encompassing all current controlling devices such as bipolar transistors and field effect transistors which are characterized by a control terminal (such as the gate of an FET) which controls the amount of current flowing in a conduction path (such as the drain to source path of an FET). For example, in a field effect transistor, the gate voltage controls the amount of current flowing from drain to source. In the preferred embodiment CMOS devices are utilized but one skilled in the art will readily appreciate that this invention could be realized with any technology capable of forming resistors, transistors and current mirrors or equivalents thereof.

Thus it is apparent that in accordance with the present invention an apparatus that fully satisfies the objectives, aims and advantages is set forth above. While the invention has been described in conjunction with specific embodiments, it is evident that many alternatives, modifications and variations will be apparent to those skilled in the art in light of the foregoing description. Accordingly, it is intended that the present invention embrace all such alternatives, modifications and variations as fall within the spirit and broad scope of the appended claims.

What is claimed is:

1. A resistance comparator having an input and output, comprising:
   current source means having a reference current output coupled to a first conduction path and a current limited output coupled to a second conduction path;
   first current control means having a first control node for controlling the current flow in said first conduction path;
   means for coupling a reference resistance in series with said first conduction path;
   second current control means having second control node for controlling the current flow in said second conduction path;
   input means for coupling an input resistance in series with said second conduction path; and
   means for supplying a bias signal to said first and second control nodes of said first and second current control means respectively,
   whereby, the output is in a first logic state when said input resistance is less than a predetermined value and in a second logic state when said input resistance is greater than said predetermined value.

2. The resistance comparator of claim 1, wherein said first and second current control means includes first and second transistors, respectively.

3. The resistance comparator of claim 2, wherein said current source means includes a current mirror producing a mirror current and said limited current is the mirror current.

4. The resistance comparator of claim 3, wherein said current source means includes means for limiting said mirror current at approximately the value of said reference current so that a logical voltage transition occurs at said output when said input resistance approximately equals said reference resistance.

5. The resistance comparator of claim 3, wherein said current source means includes means for limiting said mirror current at a predetermined multiple of said reference current so that a logical voltage transition occurs at said output when said input resistance is a predetermined fraction of said reference resistance.

6. The resistance comparator of claim 3, wherein said current source means includes means for limiting said mirror current at a predetermined fraction of said reference current so that a logical voltage transition occurs at said output when said input resistance is a predetermined multiple of said reference resistance.

7. The resistance comparator of claim 3, wherein said first and second control nodes are coupled together and to a single bias network.

8. The resistance comparator of claim 7, wherein said bias means includes means for temperature compensating said bias signal.

9. The resistance comparator of claim 8, wherein said second conduction path and said second transistor means are coupled together at a junction and further including a logic gate having an input connected to the junction of said second conduction path and said second transistor means.

10. The resistance comparator of claim 9, wherein said logic gate is an inverter.

11. The resistance comparator of claim 10, wherein said input resistance includes the contact resistance of a switch.

12. The resistance comparator of claims 11, wherein said first and second transistors are CMOS field effect transistors.

13. The resistance comparator of claim 4, wherein said current mirror includes third and fourth transistors, each having substantially the same electrical charateristics.

14. A resistance comparator having an input and an output, comprising:
   a current mirror having a reference current path and a mirror current path;
   a first transistor means having a first control node for controlling the current flow in said reference current path;
   a reference resistor coupled in series with said reference current path;

a second transistor means having a second control node for controlling the current flow in said mirror current path;

input means for coupling an input resistance in series with said mirror current path; and means for biasing said first and second nodes of said first and second transistor means respectively, whereby, the output is in a first logic state when said input resistance is less than a predetermined value and in a second logic state when said input resistance is greater than said predetermined value.

15. The resistance comparator of claim 14, wherein said control nodes are coupled together and to a single bias network.

16. The resistance comparator of claim 15 wherein said second transistor means and said mirror current path are coupled together at a junction and further including a logic gate having an input connected to the junction of said second transistor means and said mirror current path.

17. The resistance comparator of claim 16, wherein said input resistance is the contact resistance of a switch.

18. A switch detector circuit having an output, comprising:

a current mirror having a reference current output and a mirror current output;

a first field effect transistor operatively connected to control the current flowing from said reference current output into its drain;

a reference resistor coupled in series with the source of said first field effect transistor;

a second field effect transistor operatively connected to control the current flowing from said mirror current output into said second field effect transistor's drain;

means for coupling a switch having contact resistance in series with the source of said second field effect transistor; and means for applying a bias voltage to the gates of said first and second field effect transistors, whereby, a logic state transition occurs at the output indicating a switch closure when the contact resistance of said switch is less than a predetermined value.

* * * * *